United States Patent

Sabnis et al.

[11] Patent Number: 5,998,090
[45] Date of Patent: Dec. 7, 1999

[54] HIGH OPTICAL DENSITY ULTRA THIN ORGANIC BLACK MATRIX SYSTEM

[75] Inventors: Ram W. Sabnis; Terry L. Brewer; Robert E. Nichols; Edith G. Hays, all of Rolla; Michael D. Stroder, Springfield, all of Mo.; Akira Yanagimoto, Musashino, Japan; Yasuhisa Sone, Funabashi, Japan; Yoshitane Watanabe, Tokyo, Japan; Kiyomi Ema, Chiba, Japan

[73] Assignees: Brewer Science, Inc., Rolla, Mo.; Nissan Chemical Industries, Ltd., Japan

[21] Appl. No.: 08/982,233

[22] Filed: Dec. 1, 1997

[51] Int. Cl.$^6$ .................. G03F 7/004; C08K 3/04
[52] U.S. Cl. ............... 430/270.1; 430/7; 524/495; 524/496; 523/215
[58] Field of Search .................. 430/7, 627, 270.1; 523/215; 524/495, 496

[56] References Cited

U.S. PATENT DOCUMENTS 4,822,718  4/1989  Latham et al. .
5,176,971  1/1993  Shimamura et al. .
5,368,976  11/1994  Tajima et al. .
5,378,274  1/1995  Yokoyama et al. .
5,587,818  12/1996  Lee .

OTHER PUBLICATIONS

Asia Display 98, pp. 653–656 by T. Terashita, et al entitled "Fully Self–Aligned Organic Electroluminescent Devices with Dual Side–Wall Structures".

Yamanaka et al., SID Digest—Integrated Black Matrix on TFT Arrays, 1992, 23:789.

Hesler et al., SID Digest—Pigment–Dispersed Organic Black–Matrix Photoresists for LCD Color Filters, 1995, 26:446.

Hasumi et al., EURO Display 96—Carbon Dispersed Organic Black Matrix on Thin Film Transistor Liquid Crystal Display, 1996, 16:237.

*Primary Examiner*—Tae Yoon
*Attorney, Agent, or Firm*—Veo Peoples, Jr.; Holly M. Amjad

[57] ABSTRACT

A high optical density, i.e., $\geq 3.0$, at 1 micron or less film thickness, black matrix is disclosed having improved stability and shelf life as a consequence of admixing Pigment Black 7 and organic dye or dye mixtures on a polyimide polymer vehicle.

11 Claims, 8 Drawing Sheets

FLOW CHART OF MANUFACTURING PROCESS OF BM

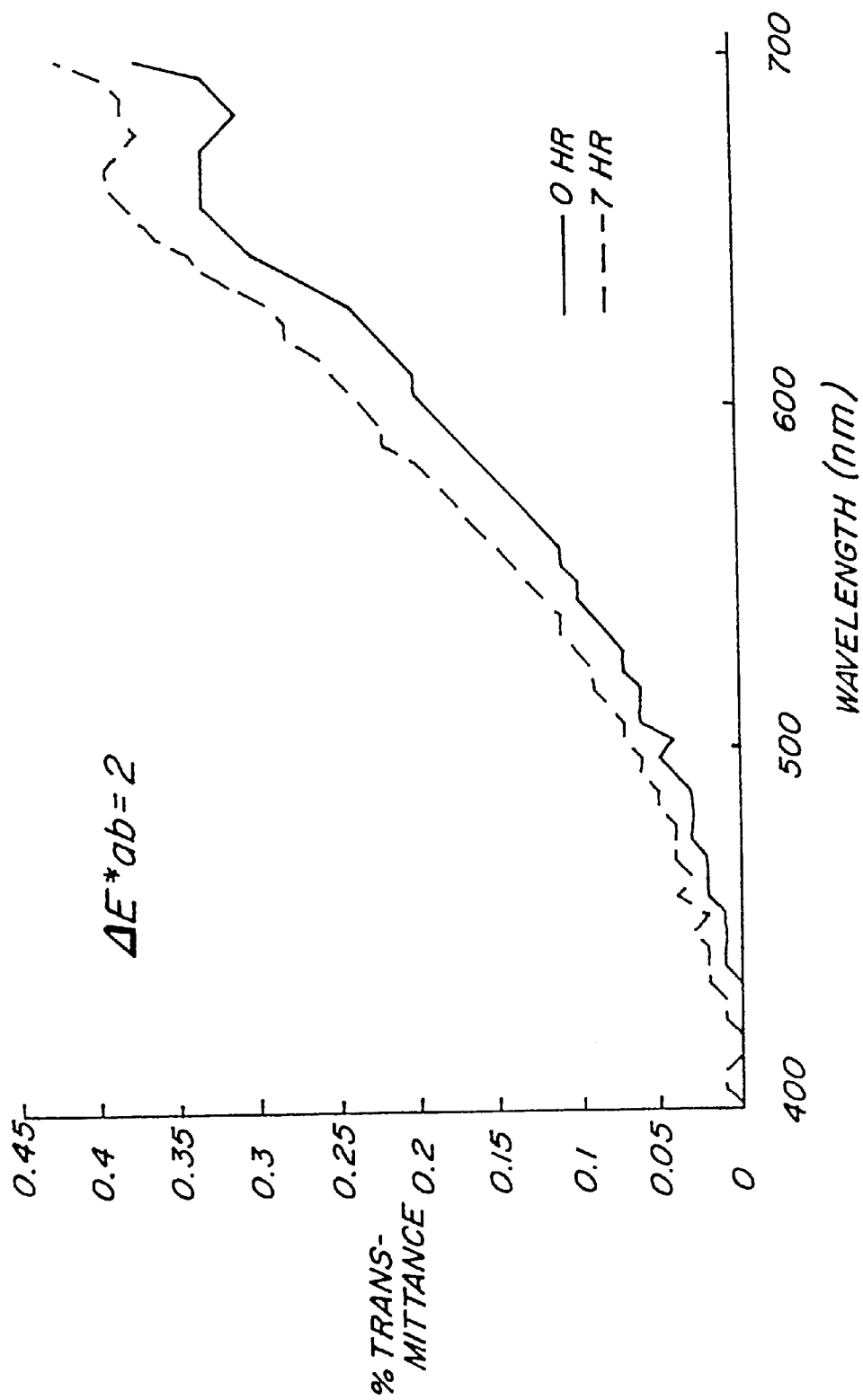

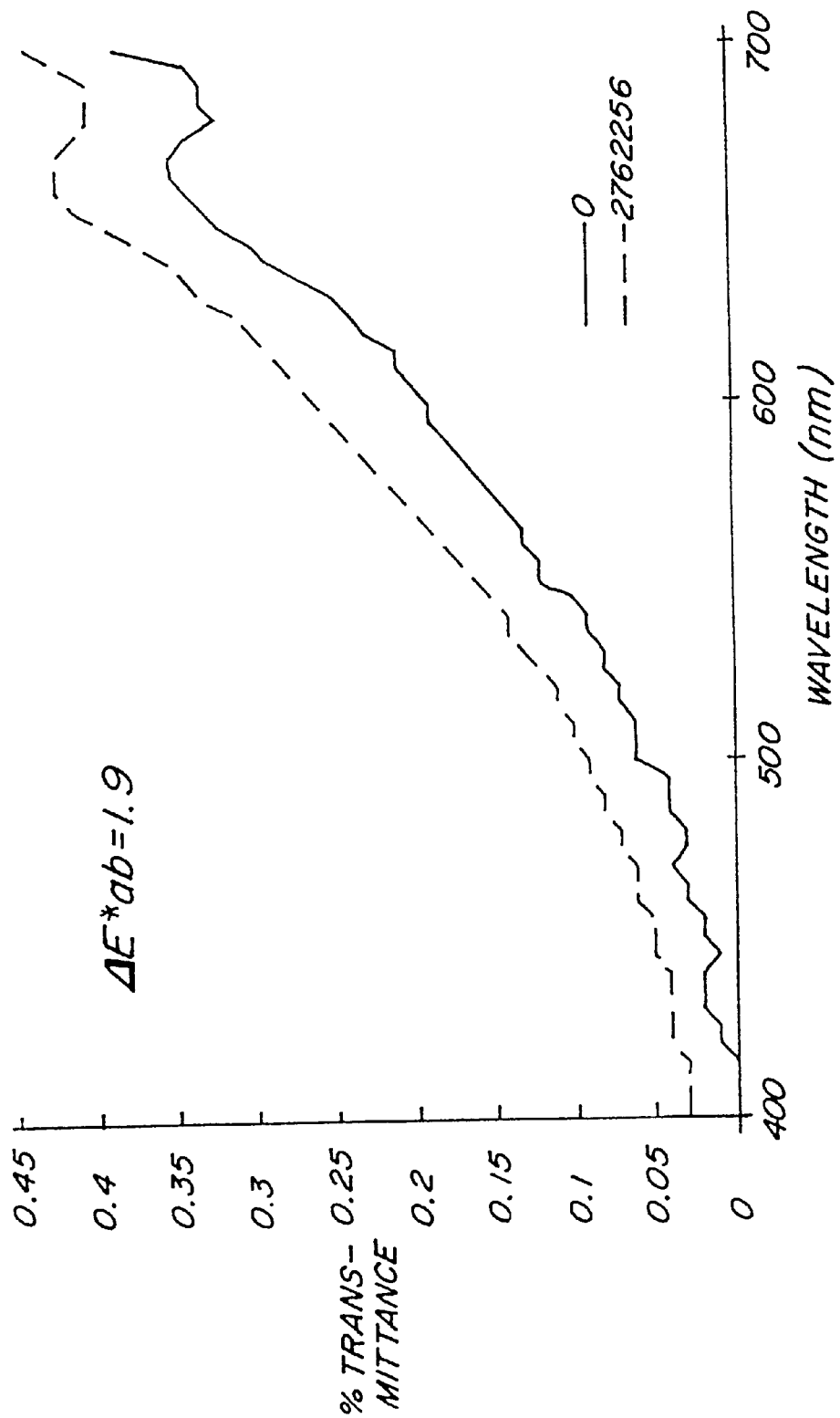

HIGH OPTICAL DENSITY ULTRA THIN ORGANIC BLACK MATRIX SYSTEM

BACKGROUND OF INVENTION

1. Field of Invention

The present invention relates to organic black matrices for color filter plate manufacture and to methods for making the same. It particularly relates to black matrices, having high optical density at ultra thin film thicknesses, excellent evenness, high strength, low cost and being useful for the production of a variety of display devices.

2. Background of the Prior Art

Multicolor liquid crystal displays (LCDs) are routinely produced having a thin, light-absorbent film, called a black matrix, applied to an array of color pixels which together form a color filter plate. The processing of such color filter plates remains one of the most troublesome steps during mass production of the LCDs because such processing normally employs a black matrix film made from sputtered chrome.

A spin-coatable, organic polymer based black matrix would tend to be more environmentally friendly than chrome, easier to reproduce, and offer lithographic processing advantages. However, there are at least two types of color filter plates for LCDs where organic polymer black matrices are woefully expensive and/or lack the desired performance. That is, the unavailability of an organic black matrix photoresist having sufficiently high optical density at ultra thin film thickness, has hampered the advancement of 1) thin film transistor (TFT)-arrays for TFT-LCDs and 2) super twisted nematic (STN) LCDs.

The optical density (O.D.) of the black matrix must be greater than 2.0 in order to block the transmission of light to the TFT or STN displays. Otherwise, photo leaks from non-display areas will reduce the contrast ratio and create adverse photo leakage current. In other words, one can enhance the contrast of the LCD by eliminating the light leakage which would otherwise occur through spaces patterned between the red, green, and blue (RGB) pixels on the color filter plate. The technical goal is to keep the light transmission at or below 1%, across the entire spectrum of from ultraviolet to infrared, at ultra thin black matrix film thicknesses.

It has proven extremely difficult, if not impossible, to manufacture an organic black matrix having an O.D. of $\geq 3.0$ at ultra thin black matrix film thicknesses. Although O.D. greater than, or equal to, 2.0 have been achieved for organic black matrices at a 2 micron polymer thickness, such thick layers tend to cause a number of defects. For example, the so-called reverse tilt inside each pixel display area occurs at a gap of 2 microns. Reverse tilt causes defects in image and contrast deterioration. Overcoming that drawback, inter alia, requires an organic black matrix film having O.D. greater than 2.0 at a thickness of 1.0 micron or less.

Chrome Based Black Matrix

Therefore, despite 1) the high cost-of-ownership,
2) the complexity of the sputtering process,
3) the potential environmental problems, and
4) a higher reflectance than desired, the most common black matrix material has continued to be sputtered chrome. Vacuum evaporation and other coating techniques for metals such as nickel, aluminum and even chromium have been contemplated, but sputtering remains the most common technique and chrome remains the most common material, because other techniques and other materials, thus far, lack sufficiently high O.D. ($\geq 3.0$) to provide enhanced contrast and high resolution, at sufficiently ultra thin thicknesses (1 micron or less) to be commercially effective for various display applications such as TFT and STN.

U.S. Pat. No. 5,378,274 by Yokoyama, et al., and U.S. Pat. No. 5,587,818 by S. Lee disclose typical chrome based black matrices for LCD's. That is, chromium is sputtered to form a thin film of about 2000 Å. As previously discussed, such sputtering is an undesirably complex and expensive manufacturing process which poses serious environmental problems.

Dye Based Black Matrix Systems

U.S. Pat. No. 4,822,718 by Latham discloses an alternative potential black matrix for color filters. It contains a polyimide precursor vehicle and dyes. The color filters are used in color liquid crystal displays, light emitting diodes, photodiodes, and solid state lasers. However these black matrix compositions have several drawbacks, as a consequence of using dyes, rather than pigments, as the coloring agents. The dyed systems have lower heat, light and chemical resistance than desired for many applications. Moreover, dyes are not completely soluble in the solvent and polyimide vehicle system, thus the dyes fail to absorb light across a sufficiently broad spectrum of wavelengths. For example, Latham uses blue and brown dyes and, while not illustrating any data on optical density, we have that the desired optical density ($\geq 3.0$) is not achievable using blue and brown dyes. Also, the dyed composition has long process steps which tend to lower production yield and raise fabrication cost.

U.S. Pat. No. 5,176,971 by Shimamura, et al., also discloses a dyed black matrix composition for color filters, which contains dyes and a polyimide precursor vehicle for use in color LCD devices. Its system is subject to fading as a consequence of the composition's limited heat stability. The dyes are said to have a relatively low thermal resistance. Additionally, a resin-surface modifier is added to the composition so as to impart water and oil repellency to the surface of the coating layer. The presence of excessive amounts of this surface modifier, however, impedes control of the uniformity of the thickness of the coating layer. Thus, even with the surface modifiers, the composition shows poor performance with respect to heat, light and chemical fastness. Furthermore, relative weight proportions of dye and polyimide must be carefully controlled; otherwise excessive dye will leak into the photoresist at a later step.

Pigment-Carbon Black Based Black Matrix Systems

It has been disclosed by Hesler, et al., in the article "Pigment-Dispersed Organic Black Matrix Photoresists for LCD Color Filters," *SID Digest,* 26:446 (1995); that carbon black dispersed in acrylic polymer provided an average optical density of 2.8 for 1.5 µm film thickness. However it reports poor reproducibility and poor coating properties. The composition needed improvement in image quality.

As disclosed by Yamanaka, et al., in his article, "Integrated Black Matrix on TFT Arrays," *SID Digest,* 23:789 (1992); carbon black, even with advanced acrylic photo polymer, does not achieve OD greater than 2.0, at thickness less than 2 µm without creating crosstalk. Yamanaka also describes the disadvantage of a 2 µm "step size" (or thickness). It is so large that it results in reverse tilt inside each pixel display area. This causes spot defects in image and contrast deterioration.

Hasumi, et al., in his article "Carbon Dispersed Organic Black Matrix on Thin Film Transistor," *Proc. of Int. Display*

Res. Conf. (EuroDisplay-96), 16:237 (1996) also discloses a carbon black dispersed system providing OD more than 2.0 at 1.5 μm film thickness, but presumably, like Yamanaka, it is also subject to crosstalk.

U.S. Pat. No. 5,368,976 by Tajima, et al., discloses another pigment-dispersed color filter composition useful for the production of LCD and charged coupled devices. The system requires controlling the molecular weight (M.W.) of a radiation-sensitive acrylic block copolymer vehicle. If M.W. exceeds 500,000, then scum develops around the pixels, causing insufficient sharpness at pattern edge, surface soiling, and excess resin at non-pixel portions. If M.W. is less than 10,000, the development time margin is deleteriously decreased. The radiation-sensitive copolymer composition promotes adhesion to the substrate, facilitates transmittance and aids in color contrast. The acrylic type copolymer has limited thermal stability and poor photospeed. The pigment, copolymer and a radiation sensitive component are dispersed via grinding in a ball mill for 18 hours which is unduly time consuming. The dispersed pigment is filtered through a 10 μm filter which allows pigment particle sizes in the formulation which fabricate into low transparency film. The shelf life of one week in a dark place at room temperature is too short. The dispersion needs dark conditions and is not stable after one week. The composition uses Pigment Black 1 and Pigment Black 7 only. Pigment Black 1 does not provide high optical density and the process does not use any dyes.

In summary, the previous black matrices have several drawbacks which may be listed as follows:

Chrome based black matrix suffers from, inter alia, high cost, poor adhesion, and toxicity concerns.

Dyed matrices are limited by the generally lower absorptivity of black dyes in comparison to black pigments and the limited solubility of such dyes either in solvents or a polymer matrix. Also, dyed formulations do not provide sufficient heat, light and chemical stability.

Pigmented coatings suffer from one or more of the following problems: 1) the formulations are unstable against gelation or flocculation at the required high carbon black loadings, making it very difficult to have long shelf life for the pigmented systems; 2) if the formulations are designed to be photosensitive, they can not be too highly loaded with carbon black without losing their imaging properties; and 3) formulations containing non-carbon black pigments do not provide very high optical density, while 4) carbon black pigments have particle sizes too large to permit sufficiently thin layer thickness at the requisite high optical densities.

The cited prior art reveals the need for a black matrix composition with very high optical density (≧3.0), and with heat, light, and chemical fastness and longer shelf life. The prior art also illustrates the need for a composition with low cost, less manufacturing (and processing) time, long shelf life, and environmentally safe.

SUMMARY OF THE INVENTION

The present invention is directed towards a black matrix composition comprising a pigment:dye system for use in the manufacture of various display applications. This black matrix: 1) can be applied by spin coating; 2) can be imaged using the same process used for RGB pixels; 3) can be developed using the same process used for RGB pixels; 4) the average optical density for the 1 μm or less film thicknesses over the region 400–700 nm of ≧3.0 (very high); 5) has longer shelf life (can be more than three months at room temperature and more than one year in freezer); 6) less grinding time; 7) less spin coat time; 8) inexpensive pigments; 9) excellent coating and imaging characteristics; and (10) much lower manufacturing cost compared to chrome black matrices.

The composition keeps transmission at or below 1% across the spectrum at a film thickness of 1 μm or less (ensuring O.D. ≧3.0), while achieving excellent imaging characteristics. This system is a high performance, low cost alternative to chrome.

The inventors have developed a novel very high optical density (≧3.0 @ 1 μm or less film thicknesses) black matrix system for a wide variety of display applications including, for example, TFT, TN, STN, EL, and plasma.

It is therefore a principle object of the present invention to provide a superior black matrix system.

It is a further object of the present invention to provide a novel method and composition having high heat, light, chemical resistance and high adhesive strength, particularly on glass substrates.

It is an additional principle objective of the invention to provide a very high optical density material well suited for various display applications and which can be applied by spin coating and patterned by photolithography.

It is also an object of the invention to provide a simpler process with higher performance standards and superior environmental safety.

It is an additional object of the invention to provide a system with high yield, less manufacturing and processing time, and excellent shelf life at low cost compared to chrome black matrices.

BRIEF DESCRIPTION OF THE DRAWINGS

FIG. 7 demonstrates excellent thermal stability at 230° C. for 7 hours for Example 1.

FIG. 8 demonstrates the superior light resistance of the black matrix from Example 1 after 2.8 million lux hours exposure.

DETAILED DESCRIPTION OF THE INVENTION

Figure 1:
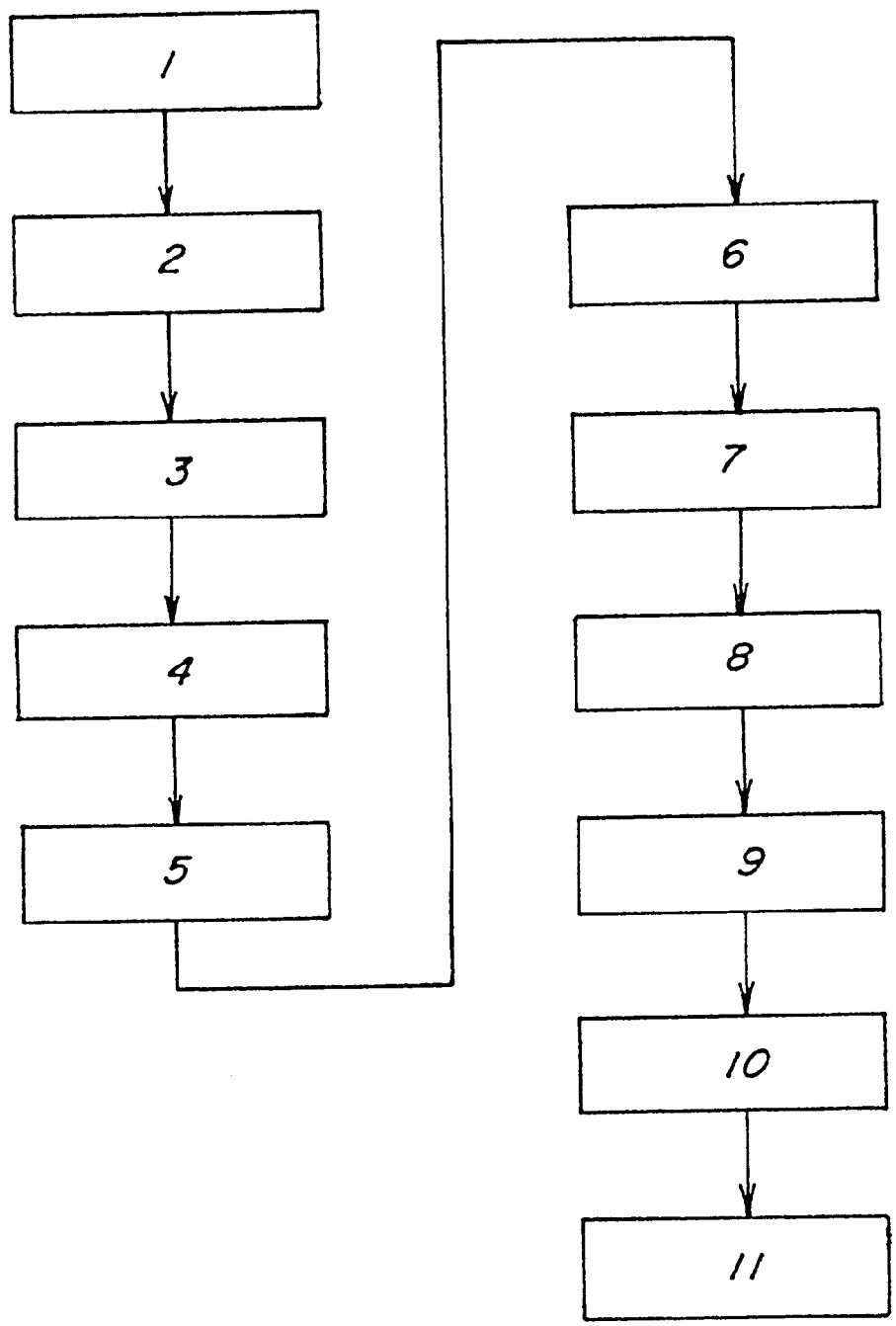
FIG. 1 is a flow chart explaining the manufacturing process of a black matrix according to the present invention.

The role of black matrix is to block the TFT from light and to protect the contrast ratio from reduction which might arise from possible photoleaks through nondisplay areas.

The novel black matrix system of the present invention is characterized by an optical density of equal to or greater than 3.0 at a cured film thickness of 1 μm or less. The system comprises a pigment:dye combination in a predetermined proportion. The polymer vehicle for the black matrix of the present invention typically includes a polyimide precursor which reacts in situ to form a polyimide resin. The pigment component of the composition is an inexpensive, high performance carbon black, preferably Pigment Black 7. The dye component may be a solvent soluble, light absorbing dye, preferably a blue and brown mixture. Suitable solvents include cyclic ketones, alcohols, esters, ethers and their mixtures. The pigment and dyes used in the present invention are preferably compatible with the polyimide resin and a suitable dispersant.

Typical Compositions

Polyimides are well known for high thermal stability, resistivity and dielectric strength. They provide excellent imaging characteristics, dyeability and coating properties. The vehicle for black matrix typically includes a polyimide precursor which reacts in use to form a polyimide resin. The precursor typically includes a polyamic acid (PAA) prepared by reacting oxydianiline (ODA) with pyromellitic dianhydride (PMDA) and/or benzophenone tetracarboxylic dianhydride (BTDA). The vehicle components being present in appropriate stoichiometric amounts (U.S. Pat. No. 4,822,718). Other equivalent polyamic acids and polyamic precursors may be used which are summarized in Table 1.

TABLE 1

| DIAMINES | DIANHYDRIDES |
|---|---|
| p-Phenylenediamine | 3,3',4,4'-Benzophenone-tetracarboxylic dianhydride |
| 3,3'-dimethy-4,4'-diaminobiphenyl | Pyromellitic dianhydride |
| 1,4-bis(4-aminophenoxy)benzene | 3,3',4,4'-Biphenyl tetracarboxylic dianhydride |
| 4,4'-Bis(4-aminophenoxy)-biphenyl | 4,4'-Oxydiphthalic anhydride |
| Bis-4(-[4-aminophenoxy]phenyl)ether | 3,3',4,4'-Diiphenylsulfone tetracarboxylic-dianhydride |
| 4,4'-Oxydianiline | 1,2,3,4-cyclobutane-tetracarboxylic dianhydride |
| 4,4'-Diaminodiphenyl sulfide | |
| 4,4'-Diaminodiphenyl sulfone | |
| 2,2'-Bis(4-[4-aminophenoxy]phenyl)sulfone | |
| 9,10-bis(4-aminophenyl)-anthracene | |

Pigments of the present invention are macroscopic particles having high surface area and a strong tendency to flocculate. Flocculation can create haze and light scattering aggregates and cause inconsistent processing as a result of variations in solution rheology. However, in the present invention, a stable dispersion with superior processing and performance characteristics is achieved. Examples of the high performance and low cost carbon black pigments which are preferred for the very high optical density required in TFT, TN, STN, EL and plasma applications include the different types and grades of high color, low cost, surface treated carbon black pigments which are listed in the Color Index as Pigment Black 7, C.I. #77266. The final particle size of the pigment is 0.01 to 0.2 microns. Pigment Black 7 may be known as acetylene black, channel black, furnace black, and thermal black. Examples of tradenames for Pigment Black 7 are parenthetically expressed as set forth below. Pigment Black 7 (Monarch 1000; Cabot Corporation), Pigment Black 7 (Monarch 1100; Cabot Corporation), Pigment Black 7 (Monarch 1300; Cabot Corporation), Pigment Black 7 (Monarch 1400; Cabot Corporation), Pigment Black 7 (Raven 7000; Columbian Chemical Co.), Pigment Black 7 (Raven 5000 Ultra; Columbian Chemical Co.), Pigment Black 7 (Special Black FW 200; Degussa Corporation), Pigment Black 7 (Special Black 6; Degussa Corporation), Pigment Black 7 (Special Black 4; Degussa Corporation).

Examples of solvent soluble, light absorbing dyes useful in the present invention are DARC 100 (Brewer Science, Inc.; U.S. Pat. No. 5,340,619), Solvent Black 35 (Zapon Black X50; BASF Corporation), Solvent Black 27 (Zapon Black X51; BASF Corporation), Solvent Black 3 (Neptun Black X60; BASF Corporation), Solvent Black 5 (Flexo Black X12; BASF Corporation), Solvent Black 7 (Neptun Black NB X14; BASF Corporation), Solvent Black 46 (Neptun A Black X17; BASF Corporation), Solvent Black 47 (Neopen Black X58; BASF Corporation), Solvent Black 28 (Orasol Black CN; Ciba-Geigy Corporation), Solvent Black 29 (Orasol Black RL; Ciba-Geigy Corporation), Solvent Black 45 (Savinyl Black RLS; Sandoz Corporation).

Table 2 shows examples of compositions of the invention evaluated along with their effects on the shelf life of the black matrix. Polyimides in Table 2 are polyamic acids typically prepared by reacting ODA with PMDA and/or BTDA. The dyes used in DARC 100 are typically a mixture of Solvent Brown 44 (Orasol brown LRL) and Solvent Blue 67 (Orasol blue GN), the ratio of which is from 1:3 to 5:1 by weight, preferably 1.3:1.0. Disperbyk 164 is used in each sample and the amount of Pigment Black 7 was the same as in Example 1.

TABLE 2

| DYE COMPONENT/ | | | SHELF LIFE OF BLACK MATRIX | |
|---|---|---|---|---|
| C. I. NAME | POLYMER | COMPANY | ROOM TEMPERATURE | FREEZER |
| No dyes | Polyimide | — | 1 day | 3 days |
| DARC 100 ® | Polyimide | Brewer Science, Inc. | >90 days | >365 days |
| Solvent Black 35 | Polyimide | BASF Corporation | 34 days | 90 days |
| Solvent Black 27 | Polyimide | BASF Corporation | 5 days | 19 days |
| Solvent Black 3 | Polyimide | BASF Corporation | 14 days | 40 days |
| Solvent Black 5 | Polyimide | BASF Corporation | 10 days | 36 days |
| Solvent Black 7 | Polyimide | BASF Corporation | 12 days | 39 days |
| Solvent Black 46 | Polyimide | BASF Corporation | 4 days | 16 days |
| Solvent Black 47 | Polyimide | BASF Corporation | 5 days | 18 days |
| Solvent Black 28 | Polyimide | Ciba-Geigy Corporation | 13 days | 38 days |
| Solvent Black 29 | Polyimide | Ciba-Geigy Corporation | 12 days | 40 days |
| Solvent Black 45 | Polyimide | Sandoz Corporation | 36 days | 92 days |

A broad spectrum of dispersants were screened by measuring the viscosity of pigment dispersion at different shear rates. The viscosity of a Newtonian dispersion is independent of the rate of shear. Table 3 represents the various dispersants evaluated, and includes the stability of the dispersions.

TABLE 3

| DISPERSING AGENT | COMPANY | CLASS | STABILITY OF DISPERSION |
|---|---|---|---|
| Disperbyk-160 | Byk-Chemie | Cationic | 8 hrs. |
| Disperbyk-161 | Byk-Chemie | Cationic | 10 hrs. |
| Disperbyk-162 | Byk-Chemie | Cationic | 8 hrs. |
| Disperbyk-163 | Byk-Chemie | Cationic | 22 hrs. |
| Disperbyk-164 | Byk-Chemie | Cationic | 24 hrs. |
| Disperbyk-166 | Byk-Chemie | Cationic | 3 hrs. |
| Lactimon | Byk-Chemie | Anionic | 8 hrs. |
| Bykumen | Byk-Chemie | Anionic | 10 hrs. |
| Dumasperse 535 | Hickson | Anionic | 2 hrs. |
| Dumasperse 540 | Hickson | Anionic | 8 hrs. |
| Dumasperse 545 | Hickson | Anionic | 1 hr. |
| Mazsperse 85B | PPG | Nonionic | 10 hrs. |
| Mazsperse SF 19 | PPG | Nonionic | 3 hrs. |
| Nuosperse 657 | Huls | Nonionic | 2 hrs. |
| Nuosperse 700 | Huls | Anionic | 9 hrs. |
| Solsperse 12000 | Zeneca | Anionic | 3 hrs. |
| Solsperse 27000 | Zeneca | Nonionic | 8 hrs. |

Some dispersants are completely ineffective, whereas others give fair results. Suitable dispersants include Disperbyk-163 (BYK-Chemie, USA) and Disperbyk-164 (BYK-Chemie, USA). Disperbyk-163 is a cationic dispersant composed of solution of higher molecular weight blocked copolymers with groups having strong affinity to pigments. It is less polar and is used primarily in general industrial coatings and to produce pigment concentrates. It provides a preferred embodiment and an improvement over others during storage stability tests. It shows good compatibility with resin, pigments and solvents. Disperbyk-164 is a cationic dispersant composed of solution with high molecular weight block copolymers with groups having strong affinity to pigments. It is less polar and its solids content is higher. It does not contain aromatics. It provides even better storage stability than Disperbyk 163. Suitable solvents include N-methyl-2-pyrrolidone (NMP), dimethylacetamide (DMAC), dimethylformamide (DMF), cyclohexanone, bis-2-methylethyl ether (diglyme), tetrahydrofurfuyl alcohol (THFA), dimethylsulfoxide (DMSO), xylenes, cyclic ketones, alcohols, esters, ethers and their mixtures.

Particularly Preferred Embodiments and Best Mode

The polymer vehicle for the preferred black matrix of the present invention includes a polyimide precursor which reacts in situ to form a polyimide resin. The precursor typically includes a polyamic acid prepared by reacting oxydianiline (ODA) with pyromellitic dianhydride (PMDA) and/or benzophenone tetracarboxylic dianhydride (BTDA). Other equivalent polyamic acids and polyamic precursors may be used; however, that sold under the trade name DARC polymer by Brewer Science is particularly preferred. Its components are present in appropriate stoichiometric amounts. (See U.S. Pat. No. 4,822,718.) Pigment Black 7 (Monarch 1000; Cabot Corporation) produced particularly preferred results for very high optical density and generating stable dispersions. The combination of brown and blue dyes at a weight:weight ratio of about 1.377:1.0 sold under the name DARC 100 (Brewer Science, Inc.; U.S. Pat. No. 5,340,619) and previously described is particularly preferred because it provides uniform coating and exceptional stability. (See Table 2.) Disperbyk-164 (BYK-Chemie, USA), was surprisingly stable and yielded the best mode dispersant. It improves pigment wetting, reduces the time required for the grinding process, prevents re-flocculation of the pigments, prevents hard sedimentation, reduces viscosity and avoids thixotropy, maintains better flow (rheology), prevents flooding and floating of the pigments, thus improving the degree of dispersion, and increases the gloss and color strength of the finished products. It shows excellent compatibility with resin, pigments and solvents. The most preferred solvents for the composition of the present invention are N-methyl-2-pyrrolidone (NMP) and cyclohexanone, or mixtures thereof.

The following examples illustrate the process and product of the present invention. The pigment dispersion is carried out in Eiger Mini-100 motor mill using 0.65 mm yttrium stabilized zirconium oxide beads. All percentages are by weight unless otherwise stated.

EXAMPLE 1

In a plastic beaker equipped with mechanical stirrer is added 24.06 g of N-methyl-pyrrolidone (NMP), 105.84 g of cyclohexanone, 3.776 g of Disperbyk-164, 41.22 g of DARC polymer solution (22.9% solids in NMP only), 18.88 g of Monarch 1000 pigment and 60 g of DARC 100 dye solution. The mixture is stirred at 3000 rpm for 15 min. This pigment slurry is then added to Eiger M-100 mill at 1000 rpm over a period of 15 minutes. The beaker is then rinsed with 50 g of N-methyl-pyrrolidone and rinse added to the mill. The grind speed is slowly increased to 3000 rpm. The mill is then run at 3000 rpm for 90 minutes. Formulation is then filtered through 0.2 $\mu$m filters. The formulation is summarized in Table 4.

TABLE 4

| CHEMICAL CONSTITUENT | WEIGHT IN GRAMS |
|---|---|
| N-methyl-pyrrolidone: | 74.06 g |
| Cyclohexanone: | 105.84 g |
| Disperbyk-164: | 3.776 g (20% of the weight of pigment) |
| DARC polymer polyamic acid solution: | 41.22 g (22.9% solids in NMP only) |
| Monarch 1000 pigment: | 18.88 g |
| DARC 100 dye solution: | 60 g |

DARC 100 solution typically contains 320 parts dye solids, 400 parts polymer solids and 3,280 parts solvent. Table 5 illustrates general composition with reference to weight %.

TABLE 5

| CHEMICAL COMPOSITION | WEIGHT % |
|---|---|
| Polyamic acid | 15%–20% |
| Colorant | 25%–30% |
| Dispersant | 0.8%–1.0% |
| Solvent | 50%–55% |

Figure 2:
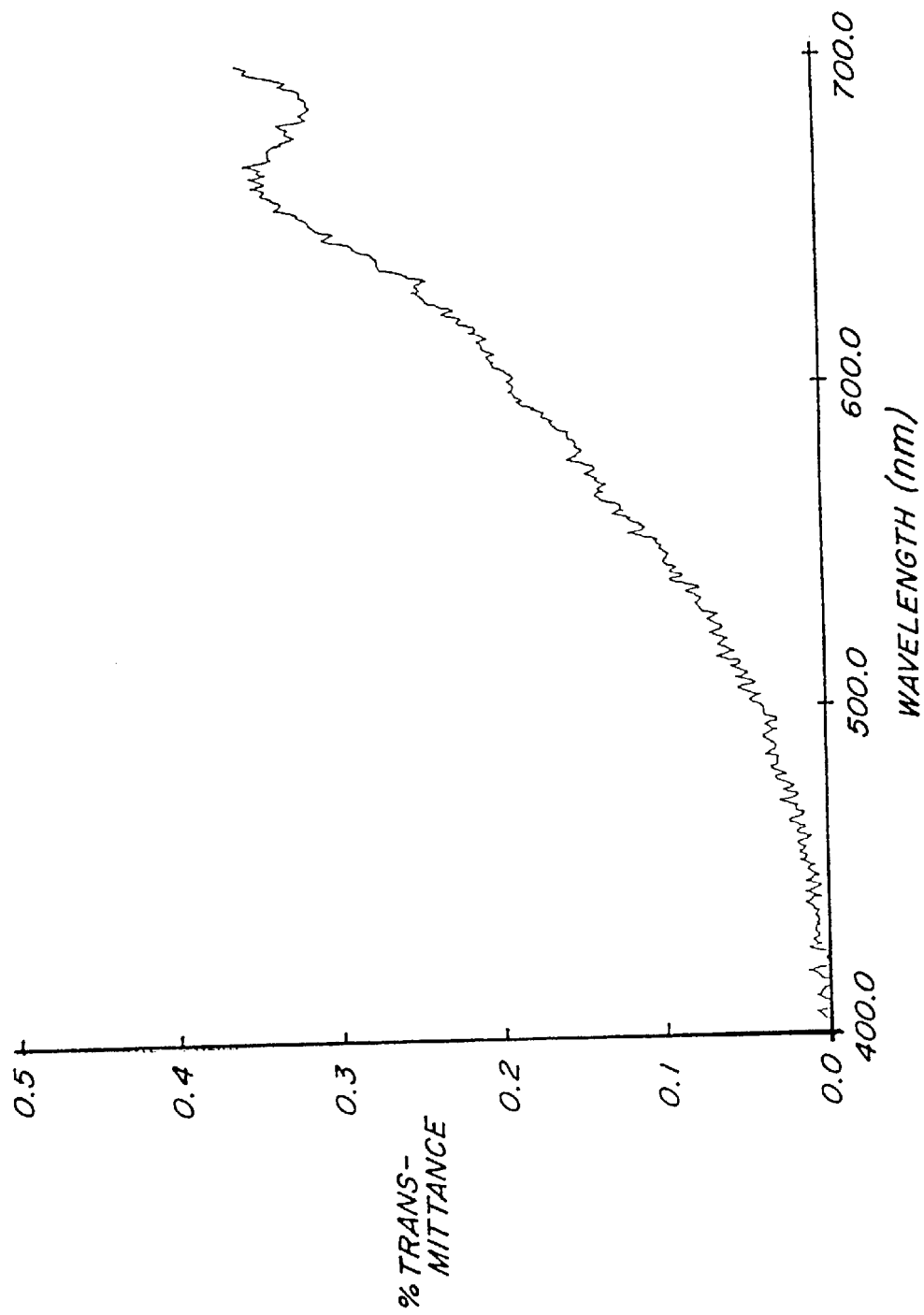
FIG. 2 is a graph showing transmission spectra of 1 μm cured film obtained in Example 1.
Figure 3:
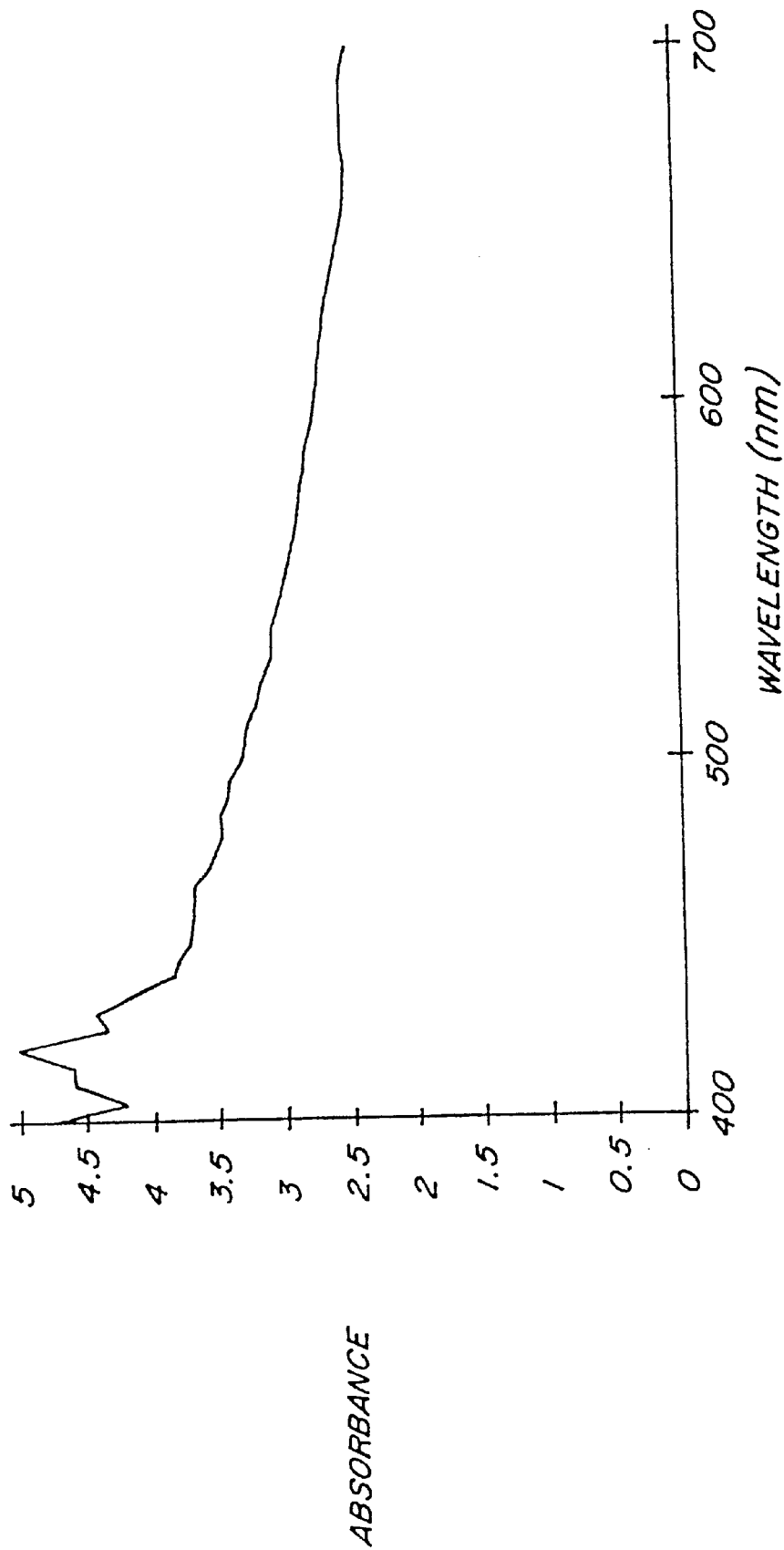
FIG. 3 is a graph showing absorbance spectra of 1 μm cured film obtained in Example 1 (optical density= absorbance @ 540 nm)
Figure 4:
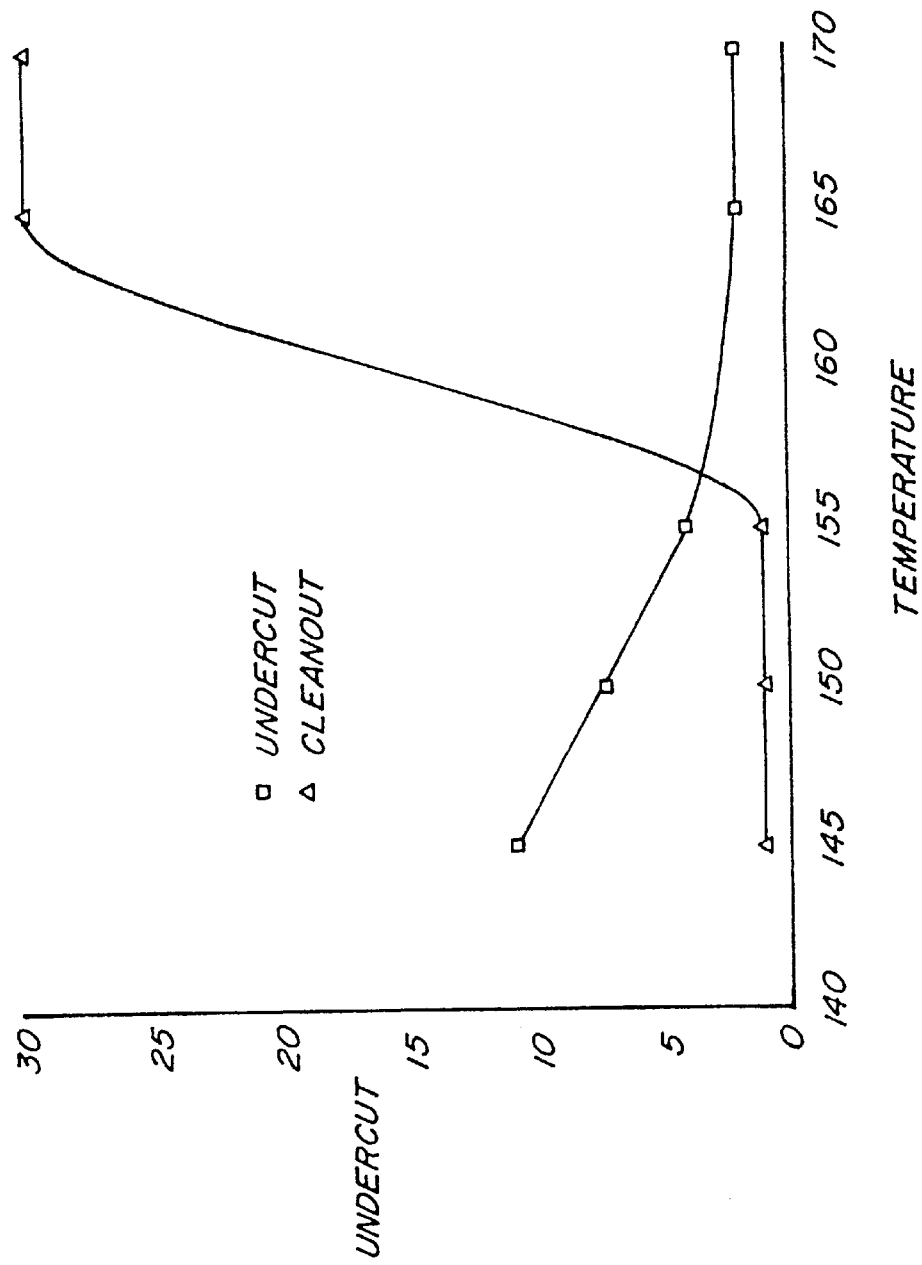
FIG. 4 shows sets of lithography data using both convection oven and hot-plate β-bake processes.
Figure 5:
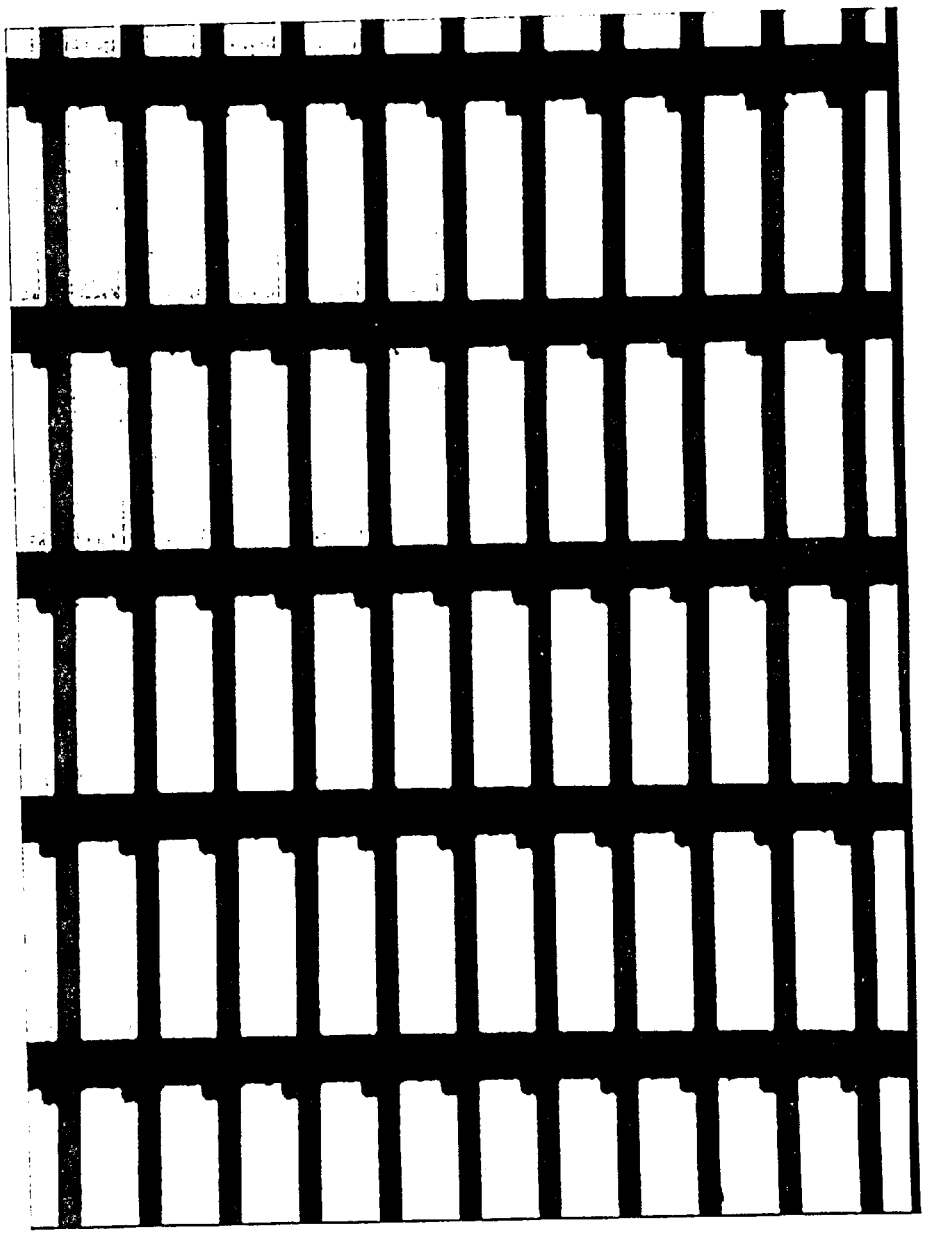
FIG. 5 is a schematic diagram illustrating photo of a resolution dagger.
Figure 6:
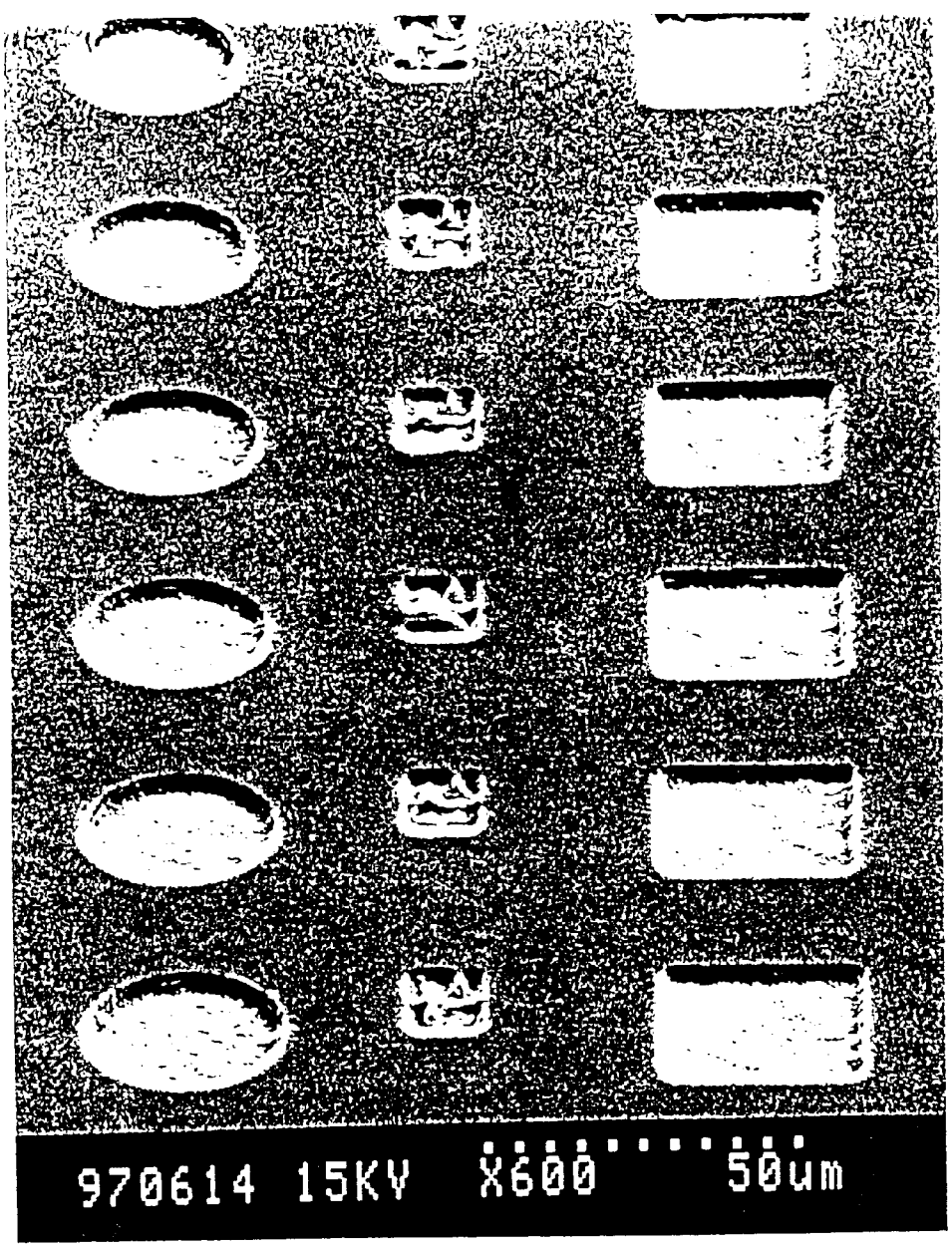
FIG. 6 demonstrates Scanning Electron Microscope (SEM) of the black matrix material after resist removal and final cure.

Referring to FIG. 2, a graph is depicted showing transmission spectra of the 1 $\mu$m film obtained in Example 1 wherein the goal of high optical density is achieved. FIG. 3 is a graph showing absorbance spectra of the 1 $\mu$m cured film obtained in Example 1 (optical density=absorbance @ 540 nm). FIG. 4 shows sets of lithography data using both convection oven and hot-plate β-bake processes. Lithography results show a wide processing latitude. Resolution down to 3 $\mu$m at 1 $\mu$m film thickness are achievable within a wide range of intermediate (β-bake) temperatures. FIG. 5 is a schematic diagram illustrating photo of a resolution dagger. FIG. 6 demonstrates Scanning Electron Microscope (SEM) of the black matrix material after resist removal and final cure. Good sidewall definition is evident in the pixel patterns.

FIG. 7 represents high thermal stability (at ≧230° C.) obtained in Example 1. Thermal stability: BM must exhibit high heat resistance for display applications. FIG. 7 shows the spectral change of Example 1 at 1 μm film thickness before and after heating. The chromatic change ($\Delta E^*_{ab}$) is less than 3($\Delta E^*_{ab}$=2) after heating in convection oven at 230° C. in air for 7 hours. Thus, the black matrix shows excellent thermal stability.

The light-resistance of the pixels is critical because these pixels are illuminated from the back light of, for example, liquid crystal displays. The black matrix at Example 1 was exposed to a Mercury-Xenon lamp (200–1300 lux) with UV cut filter. FIG. 8 shows the spectral changes of the black matrix in Example 1 after 2.8 million lux hours of exposure. The chromatic changes ($\Delta E^*_{ab}$) upon exposure are less than 3 ($\Delta E^*_{ab}$=1.9), demonstrating the superior light resistance of the black matrix.

Since color filters are exposed to solvents, acids and bases during the liquid crystal display fabrication process, chemical stability is, as earlier stated, an especially improved performance characteristic. Resistance to acids during etching of indium tin oxide (ITO) electrodes to N-methyl-2-pyrrolidone (NMP) or γ-butyrolactone commonly used as solvents for alignment layer materials and to alkalies, alcohols or detergents during cleaning of the color filters is critical. The chemical stability of black resist was evaluated by both pattern observation and chromatic changes. After dipping the pixels in the above mentioned chemical solutions for 30 minutes, patterns were found to be stable and neither swelling nor peeling was observed. (See Table 6.) The chromatic changes ($\Delta E^*_{ab}$) are less than 1, indicating very good chemical stability of the black matrix.

TABLE 6

| CHEMICALS | CHROMATIC CHANGES ($\Delta E^*_{AB}$) AFTER DIPPING FOR 30 MINUTES |
|---|---|
| N-methyl-2 -pyrrolidone | 0.11 |
| Ethanol | 0.44 |
| Acetone | 0.50 |
| γ-Butyrolactone | 0.45 |
| Isopropylalcohol | 0.81 |
| Cyclohexanone | 0.23 |
| Propylene glycol monomethyl ether acetate | 0.61 |
| 5% Hydrochloric acid | 0.38 |
| 5% Sodium carbonate | 0.85 |
| 5% Tetramethyl ammonium hydroxide | 0.79 |

Volume resistivity measurements in Example 1 for a 1 μm film are on the order of $10^4$ Ω-cm, reflectivity is 3.4%, the average optical density for the 1 μm film thickness over the region 400–700 nm is greater than 3.0, thus providing a good balance of very high optical density and electrical properties. The composition can be applied by spin coating, imaged and developed using the same process used for RGB pixels. The material has excellent shelf life (1 year in freezer; more than 3 months at room temperature). It has a low cost compared to chrome black matrix.

EXAMPLE 2

In a plastic beaker equipped with mechanical stirrer is added 31.92 g of N-methyl-pyrrolidone (NMP), 102 g of cyclohexanone, 6 g of Disperbyk-164, 26.08 g of DARC polymer (22.9% in NMP only), 30 g of Monarch 1000 and 60 g of DARC 100. The mixture is stirred at 3000 rpm for 15 minutes. This pigment slurry is then added to Eiger Mini-100 mill at 1000 rpm over a period of 15 minutes. The beaker is then rinsed with 50 g of N-methyl-pyrrolidone (NMP) and rinse added to the mill. The grind speed is slowly increased to 3000 rpm. The mill is then run at 3000 rpm for 90 minutes. Formulation is then filtered through 0.2 μm filters. The formulation is summarized in Table 7.

TABLE 7

| CHEMICAL CONSTITUENT | WEIGHT IN GRAMS |
|---|---|
| N-methyl-pyrrolidone | 81.92 g |
| Cyclohexanone | 102 g |
| Disperbyk-164 | 6 g (20% of the weight of pigment) |
| DARC polymer | 26.08 g (22.9% in NMP only) |
| Monarch 1000 | 30 g |
| DARC 100 | 60 g |

Table 8 illustrates general composition with reference to weight %.

TABLE 8

| CHEMICAL COMPOSITION | WEIGHT % |
|---|---|
| Polyamic acid | 10%–15% |
| Colorant | 30%–35% |
| Dispereant | 0.8%–1.0% |
| Solvent | 50%–55% |

Example 2 shows very high optical density, 3.6 at 1 μm film thickness over the region 400–700 nm and reflectivity of 4.1%.

EXAMPLE 3

In a plastic beaker equipped with mechanical stirrer is added 24.06 g of N-methyl-pyrrolidone (NMP), 105.84 g of cyclohexanone, 3.776 g of Disperbyk-164, 41.22 g of DARC polymer solution (22.9% solids in NMP only), 18.88 g of Monarch 1000 pigment. The mixture is stirred at 3000 rpm for 15 minutes. This pigment slurry is then added to Eiger M-100 mill at 1000 rpm over a period of 15 minutes. The beaker is then rinsed with 50 g of N-methyl-pyrrolidone and rinse added to the mill. The grind speed is slowly increased to 3000 rpm. The mill is then run at 3000 rpm for 90 minutes. Formulation is then filtered through 0.2 μm filters. The formulation is summarized in Table 9.

TABLE 9

| CHEMICAL CONSTITUENT | WEIGHT IN GRAMS |
|---|---|
| N-methyl-pyrrolidone: | 74.06 g |
| Cyclohexanone: | 105.84 g |
| Disperbyk-164: | 3.776 g (20% of the weight of pigment) |
| DARC polymer: | 41.22 g (22.9% in NMP only) |
| Monarch 1000: | 18.88 g |

Table 10 illustrates general composition with reference to weight %.

TABLE 10

| CHEMICAL COMPOSITION | WEIGHT % |
|---|---|
| Polyamic acid | 15%–20% |
| Colorant | 15%–20% |
| Dispersant | 0.8%–1.0% |
| Solvent | 50%–55% |

Example 3 represents only pigmented formulation and does not use dye components. The dye component, particularly DARC 100, plays a particularly preferred role in generating uniform coating (without particles or voids), creating stable dispersion and thereby increasing the shelf life of the formulation. The dyes, especially DARC 100, also serve to stabilize the polyimide coating containing such high levels of carbon black. Apparently, storage-stable polyimide coatings can not be produced when the selected dye stock is absent, at least not at the high carbon black levels required for obtaining an optical density $\geq 3.0$ per micron. Furthermore, by using a polyimide vehicle for the carbon black, high resolution patterning capability is obtained (via the familiar two-layer, wet etch method) without requiring the coating to be photosensitive.

EXAMPLE 4

In a plastic beaker equipped with mechanical stirrer is added 24.06 g of N-methyl-pyrrolidone (NMP), 105.84 g of cyclohexanone, 3.776 g of dispersing agent from Table 3 (not including Disperbyk-164), 41.22 g of DARC polymer (22.9% in NMP only), 18.88 g of Monarch 1000 and 60 g of DARC 100. The mixture is stirred at 3000 rpm for 15 minutes. This pigment slurry is then added to Eiger M-100 mill at 1000 rpm over a period of 15 minutes. The beaker is then rinsed with 50 g of N-methyl-pyrrolidone and rinse added to the mill. The grind speed is slowly increased to 3000 rpm. The mill is then run at 3000 rpm for 90 minutes. Formulation is then filtered through 0.2 μm filters. The formulation is summarized in Table 11.

TABLE 11

| CHEMICAL CONSTITUENT | WEIGHT IN GRAMS |
| --- | --- |
| N-methyl-pyrrolidone | 74.06 g |
| Cyclohexanone | 105.84 g |
| Dispersant (all from Table 3 except Disperbyk-164) | 3.776 g (20% of the weight of pigment) |
| DARC polymer | 41.22 g (22.9% in NMP only) |
| Monarch 1000 | 18.88 g |
| DARC 100 | 60 g |

Table 12 illustrates general composition with reference to weight %.

TABLE 12

| CHEMICAL COMPOSITION | WEIGHT % |
| --- | --- |
| Polyamic acid | 15%–20% |
| Colorant | 25%–30% |
| Dispersant | 0.8%–1.0% |
| Solvent | 50%–55% |

Example 4 represents pigment:dye systems containing a wide variety of attempted dispersing agents (includes all from Table 2 except Disperbyk-164). Dispersants used are cationic, anionic and nonionic which generate either poor or fair dispersions with turbid or nonhomogeneous formulation indicating incompatibility or poor compatibility with polymer, solvent or pigments. The formulation of Example 4 does not generate uniform coating (with particles or voids), and has lower shelf life due to the presence of a non-compatible dispersing agent. Disperbyk-164 (BYK-Chemie, USA), a cationic dispersant composed of solution with high molecular weight blocked copolymers with groups having strong affinity to pigments, gives best results as reported in Example 1.

Method of Use

Photolithography process is applied to get fine resolution and wide β-bake window. Prime substrate is cleaned. APX-K1, adhesion promoter from Shipley is coated on substrate at 3000 rpm for 30 seconds, baked on hot plate at 175° C. for 30 seconds. Black matrix formulation is coated on APX-K1 coated substrate at 1000 rpm for 25 seconds, α-baked to evaporate solvent on hot plate at 100° C. for 60 seconds. The coatings were then β-baked in conventional ovens at 120–180° C. for 30 minutes. The polyamic acids are 30%–50% imidized in this process. Photoresist is coated at 5000 rpm for 30 seconds, soft-baked on hot plate at 100° C. for 30 seconds, exposed at 400 mJ/cm$^2$ and developed. Photoresist is stripped in safestrip. Black matrix is then final cured in oven bake at 250° C. for 1 hour which completes the imidization process. Other colors are applied and processed.

Characteristic Properties

At FIG. 1, there is a flow chart explaining the manufacturing process of a black matrix according to the present invention. That is, the prime substrate is prepared at 1; the adhesion promoter is coated on the substrate at 2. The black matrix formulation is coated on the adhesion coated substrate at 3, and α-baked at 4. The coatings are then β-baked at 5. The photoresist is coated at 6, exposed at 7, and developed at 8. Photoresist is stripped at 9. The black matrix is then final cured in an oven bake at 10, thus completing the imidization process. The last step is to apply and process other colors at 11.

Industrial Applicability

The superior black matrix material of the present invention is generated having excellent heat, light and chemical resistance. The main goal of the invention is to produce a new black matrix composition having very high optical density and imaged by photolithography. This unique pattern forming material has a greatly increased processing window over conventional polyimide materials. This novel material has good durability, processability and low cost. The present invention is best suited for various display applications.

What is claimed:

1. A photolithography imageable black matrix coating material having optical density $\geq 3.0$ when coated at thicknesses of 1 micron or less and having a shelf life of 90 days or more at room temperature and 365 days or more in the freezer, consisting essentially of
   a. a polyimide precursor vehicle and a solvent system therefore;
   b. a soluble light-absorbing dye or dye mixture, said dye or dye mixture being substantially completely soluble in the vehicle and solvent system, and being effective to absorb substantially all light across a broad spectrum of from ultra violet to infrared; and
   c. a high performance, high color, surface treated carbon black pigment, and a suitable dispersant therefore in Newtonian dispersion.

2. The black matrix coating material of claim 1, wherein the polyimide vehicle solvent system is an effective mixture of N-methyl-2-pyrrolidone and cyclohexanone, the dye mixture is solvent brown 44 and solvent blue 67 at weight/weight ratio of 1:3 to 1:5.

3. The coating material of claim 1 wherein the pigment is Pigment Black 7 having a Color Index number 77266.

4. The coating material of claim 1 wherein the dispersant is a cationic dispersant composed of solution of high molecular weight blocked copolymers with groups having strong affinity to the pigment having Color Index number 77266 and containing no aromatics.

5. The coating material of claim 2 wherein the polyimide vehicle is selected from the group of reaction products of
   a. oxydianiline and pyromellitic dianhydride, and
   b. oxydianiline and benzophenone tetracarboxylic dianhydride.

6. The black matrix coating material of claim 1 comprising by weight 15% to 20% polyamic acid, 50% to 55% solvent, 25% to 30% pigment and dye combined, and 0.8% to 1.0% dispersant.

7. The black matrix coating material of claim 2 having a weight percent composition of 10% to 15% polyamic acid, 50% to 55% solvent, 30% to 35% pigment and dye, and 0.8% to 1.0% dispersant.

8. The coating material of claim 1 wherein the pigment dispersion comprises pigment particles having a particle size of 0.01 to 0.2 microns.

9. The black matrix of claim 1 wherein the polyimide vehicle solvent system is an effective mixture of N-methyl-2-pyrrolidone and cyclohexanone, the dye mixture is solvent brown 44 and solvent blue 67 at weight:weight ratio of 1:3 to 5:1, the pigment has Color Index number 77266 and the dispersant is a cationic dispersant composed of solution of high molecular weight blocked copolymers with groups having strong affinity to the pigment having Color index number 77266 and containing no aromatics.

10. A method for making an organic black matrix coating material for thin film transistor, twisted nematic, super twisted nematic, electroluminescence or plasma applications, said method comprising admixing
    a. a polyimide precursor vehicle and an effective solvent, and
    b. a Newtonian dispersion of a carbon black pigment having a Color Index number of 77266 and a particle size of 0.01 to 0.2 microns, and a light-absorbent organic broad spectrum light-absorbing dye or dye mixture capable of forming a black coating with an effective dispersant, in the said effective solvent,
    whereby the coating material's optical density is $\geq 3.0$ at 1 micron or less coating thicknesses.

11. The method of claim 10 wherein the polyimide vehicle solvent system is an effective mixture of N-methyl-2-pyrrolidone and cyclohexanone, the dye mixture is solvent brown 44 and solvent blue 67 at weight:weight ratio of 1:3 to 5:1, the pigment has Color Index number 77266 and the dispersant is a cationic dispersant composed of high molecular weight blocked copolymers with groups having strong affinity to the pigment having Color index number 77266 and containing no aromatics.

* * * * *